(12) United States Patent
Craig et al.

(10) Patent No.: US 6,168,646 B1
(45) Date of Patent: Jan. 2, 2001

(54) FLOW RATE CONTROL OF TEMPERATURE CONTROL FLUIDS

(75) Inventors: William L. Craig, Durham, NC (US); John S. Moss, Ottawa (CA)

(73) Assignee: Nortel Networks Limited, Montreal (CA)

( * ) Notice: Under 35 U.S.C. 154(b), the term of this patent shall be extended for 0 days.

(21) Appl. No.: 09/285,077

(22) Filed: Apr. 2, 1999

(51) Int. Cl.[7] ............................. B01D 46/46; B01D 46/18
(52) U.S. Cl. ........................ 95/14; 55/354; 95/19; 95/25; 95/26; 96/420; 96/421; 96/423; 96/429
(58) Field of Search ........................ 55/290, 352, 351, 55/354; 95/19, 14, 15, 25, 26, 277; 96/417, 423, 420, 421, 429

(56) References Cited

U.S. PATENT DOCUMENTS

| | | | |
|---|---|---|---|
| 2,848,064 | * 8/1958 | Gregory et al. | 55/352 |
| 2,853,155 | * 9/1958 | Peter | 55/352 |
| 3,020,976 | * 2/1962 | Hyatt | 55/354 |
| 3,102,014 | * 8/1963 | Aitkenhead | 55/352 |
| 3,175,775 | * 3/1965 | Wurtenberg et al. | 55/354 |
| 3,286,443 | * 11/1966 | Woolridge et al. | 55/354 |
| 3,324,633 | * 6/1967 | Revell | 55/354 |
| 3,350,853 | * 11/1967 | Revell | 55/354 |
| 3,368,333 | * 2/1968 | Merklin | 55/354 |
| 3,552,098 | * 1/1971 | Cochran | 55/352 |
| 3,985,528 | * 10/1976 | Revell | 55/352 |
| 4,054,521 | * 10/1977 | Winzen | 55/354 |
| 4,221,576 | * 9/1980 | Phillips, Jr. | 55/352 |
| 4,470,833 | * 9/1984 | Wolfe | 55/354 |

* cited by examiner

Primary Examiner—Duane S. Smith
(74) Attorney, Agent, or Firm—Foley & Lardner

(57) ABSTRACT

Electronic equipment having a temperature control air flow passage. A length of filter material has a length portion extending across the upstream end of the flow passage, the filter material being movable longitudinally to replace the clogged length portion with unused filter material. A filter advancement device is operable by a control device actuated when an undesirably low fluid flow rate is achieved through the length portion so as to effect filter replacement. Roller devices give up unused filter material and take up used material. A stepper motor may be used to advance filter material for replacement purposes. The control device is preferably operated upon drop in rotational speed of a fan located immediately downstream of the filter length portion, the speed drop being caused by drag as the filter becomes clogged. Alternatively, the control device comprises a switch which is operated as the filter length portion flexes it becomes clogged, or temperature sensors located at chosen sites.

20 Claims, 4 Drawing Sheets

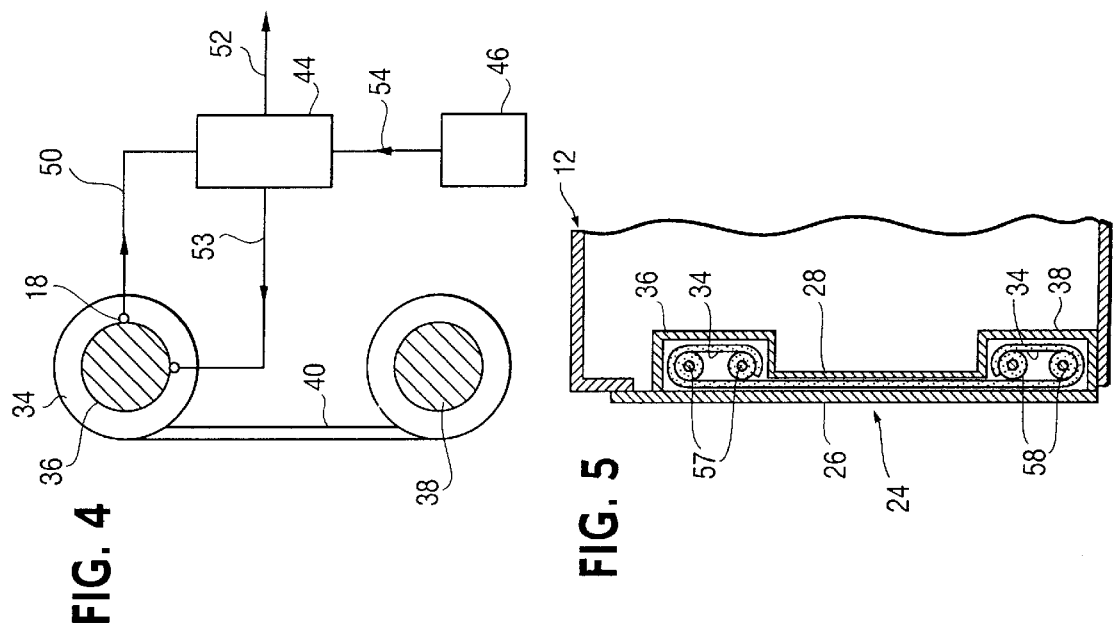
FIG. 4
FIG. 5
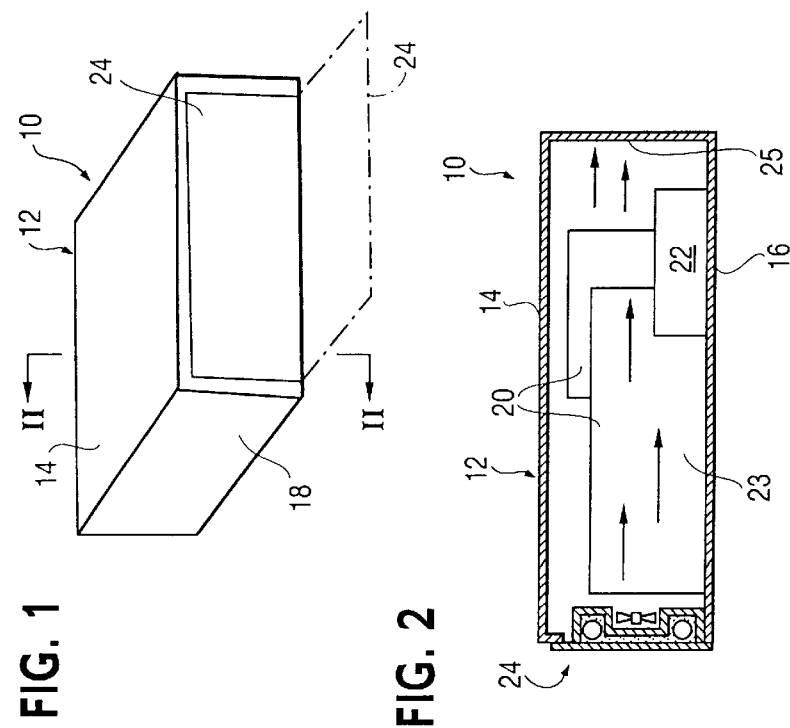
FIG. 1
FIG. 2

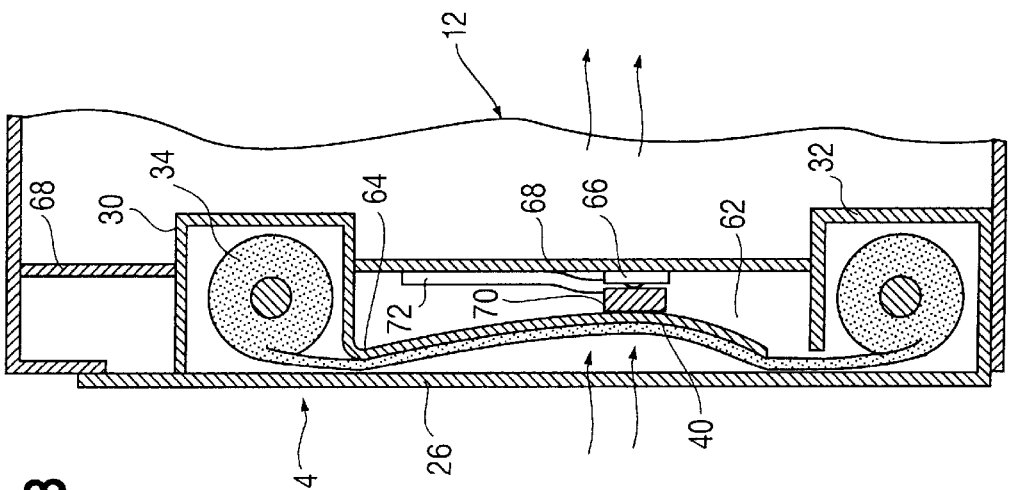
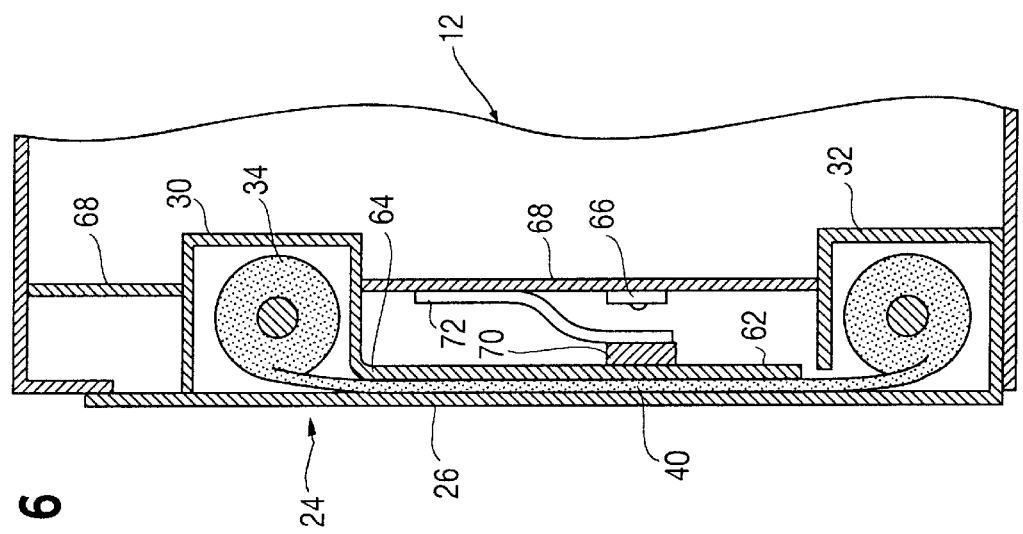

FLOW RATE CONTROL OF TEMPERATURE CONTROL FLUIDS

FIELD OF THE INVENTION

This invention relates to flow rate control of temperature control fluids.

BACKGROUND OF THE INVENTION

Many types of equipment rely, in operation, upon temperature control to ensure that the equipment operates within accepted temperature ranges at which temperature effected breakdown or deterioration of the whole or parts of the equipment. cannot, or is unlikely, to occur. Different methods and technologies are brought to bear upon temperature control for the above purpose, e.g. the use of non-enclosed temperature control fluids such as the passage of air entrained through flow passages of equipment, closed circuit fluid flow heat exchange, and the use of solid heat conductive and heat radiating structures.

One problem being considered herein is concerned with flow control of temperature control fluids in use of equipment and in which the fluid is non-enclosed, e.g. ambient air. More precisely, the problem results from the necessary filtration of air before this enters equipment in order to prevent undesirable, i.e. operationally damaging material, such as duet or other particles, from passing into the equipment. For instance, in the use of electronics equipment or some electrical equipment, it is critical to prevent ingress of airborne particles into the equipment as these may accumulate in time upon conductive surfaces with a potentially heat damaging effect, may bridge between conductive surfaces thereby shorting out circuitry, or may introduce or accelerate corrosive conditions.

While the introduction of filtering materials into equipment such as electrical or electronic equipment, effectively filters out damaging materials temperature problems may result as use of any particular filter continues. If a filter is being used efficiently, it progressively becomes contaminated with the filtered out materials thereby progressively clogging the filter. Where the filter is being used to filter a temperature control fluid passing through the equipment, clogging of the filter is attended by reduction in flow rate of the fluid which then effects increase in temperature.

Where the equipment is used indoors, the changing state of the filter may be monitored relatively simply to enable it to be changed for an unused filter at any appropriate time. However, where equipment is being used outdoors, the problem is no longer simple. Certain types of equipment, e.g. electronics equipment such as used in the telecommunications industry, needs continuous operation. The extent of the useful life of a filter when incorporated into outside equipment cannot be assessed, because from one item of equipment to another located at different sites, the filtering requirements may be widely different. Also at each site, the filtering requirements may also vary widely dependent upon weather and seasonal or other environmental conditions. The latter may vary because of change in wind direction when industrial contamination is being generated in a specific direction from the equipment. Seasonal variations may result, when equipment is located close to an agricultural site when, at various times, dust, Seeds or other plant materials become airborne.

As may be seen, therefore, outside filters particularly cannot be changed strictly on a timed basis. Outdoor equipment is provided, because of this, with alarm systems which notify a central office when filters become clogged. At such times, immediate attention is required by maintenance personnel. If such attention is not provided within due time, then equipment which is still necessarily in use may overheat thereby resulting in breakdown. This may be extremely expensive and inconvenient.

SUMMARY OF THE INVENTION

The present invention seeks to provide equipment which will require minimal filter maintenance while also minimizing the possibility of equipment breakdown.

According to one aspect of the present invention, equipment is provided having a housing, a fluid flow passage for flow of a filtered temperature control fluid through the housing, a length of filter material having a length portion extending across an upstream end of the flow passage for filtering undesirable material from the fluid, means for causing fluid flow through the length portion of the filter material and along the flow passage, filter advancement means, and control means actuable when an undesirably low rate of fluid flow is achieved through the length portion of tube filter material, to operate the advancement means so as to advance the length of filter material for a distance longitudinally to move at least some of the length portion from the upstream end of the flow passage and move unused filter material across the upstream end of the flow passage thereby to increase fluid flow through the filter material above the undesirably low rate.

It follows, from use of equipment according to the above invention, that when the undesirable low rate of fluid flow is determined to occur at still acceptably high temperatures inside the equipment, i.e., below such high levels as to result in equipment failure, overheating and resultant breakdown cannot occur so long as unused parts of the filter material are still available. In these situations, the equipment will continue to operate within satisfactory temperature ranges without requiring filter maintenance visits from personnel. In anticipation that the length of filter material will eventually have been advanced to a position where little or no unused material remains upon the length, alarm signaling means may be employed to provide a warning to a central office that the length of filter material needs replacement.

The filter material length may be short thereby allowing the advancement means to be advanced only once to move unused filter material across the fluid flow passage. However, for convenience and on a practical basis, the filter material length should be such as to provide for a substantial number of operations of the advancement means. The maximum distance along the filter material length may hence be determined by the available space for used and unused parts of the length in relation to the particular equipment under consideration.

In practical arrangements, the filler material is flexible and the advancement means includes a roller device for the take-up of used filter material. The unused filter material may he stored, for instance, in a stack with layers of the stack interconnected by material. However, it is convenient to provide two roller devices, e.g. one roller device for holding and taking up used filter material and another roller device for holding and releasing the unused filter material. Each or one of the roller devices may comprise two parallel spaced rollers with the used or unused filter material, as the case may be, extending around the two rolls and from roll to roll. This arrangement could be particularly useful, where necessary space requirements exist, when an extremely long length of filter material is employed. However, in a simple arrangement, each roller device comprises a single take-up or give-up rolls.

In roller device arrangements, the advancements means in practice also includes means for driving the roller device for take-up of used filter material.

The control means for operation of the advancement means may include any means which, in some way is affected by clogging of filter material extending across the upstream end of the flow passage so as to effect such operation. For instance, in a preferred arrangement, it is recognized that where the means for causing fluid flow comprises fan means having at least one fan downstream in the flow passage from the length portion of the filter material, a drop in pressure occurs between the fan and the filter material as clogging proceeds. In this preferred arrangement, the or each fan is expected to be driven at a constant speed when employing unused filter material. However, there will be a progressively increasing pressure drop as filter clogging increases and the pressure drop is accompanied by a drag on the fan blades with resultant decrease in rotational speed of the each fan. Signaling means of the control means is provided for the or each fan whereby upon fan rotational speed dropping to a speed corresponding to the undesirably low rate of fluid flow, a signal of a specific electrical value is sent from the fan means to effect operation of the advancement means for advancing the filter material.

Alternatively in another arrangement, it is recognized that the filter material extending across the flow passage, will, as it becomes clogged, be caused to flex in the direction of fluid flow due to suction created by the fan means. In this other arrangement, the control means comprises a switching device which is caused to operate by the filter material reaching a flexed position corresponding to the undesirably low rate of fluid flow. Actuation of the switching means effects operation of the advancement means.

In yet a further arrangement, it is recognized that decrease in fluid flow will cause an increase in temperature at downstream regions of the fluid flow passage. In this further arrangement the control means further comprises a temperature sensor disposed at these downstream regions monitors the temperature at these regions monitors the temperature at these regions and will cause operation of the advancement means upon the fluid temperature reaching an undesirable level. Alternatively, where it is important to recognize that temperatures at downstream regions are also governed by temperatures outside the equipment, so as to cause variations in incoming fluid temperature or in variations in heat emission from the equipment, another temperature sensor is placed upstream of the length portion of filter material. Undesirable differential temperature conditions between the two sensors may then be used to operate the advancement means.

The advancement means may be caused to operate so that upon the undesirably low rate of fluid flow being attained, the whole of the used length portion of the filter material extending across the upstream end of the flow passage is replaced with unused material. In this case, it is convenient for the advancement means to comprise a stepper motor to advance the filter material for the required distance to achieve this type of replacement. Alternatively, the advancement means may be caused to operate to replace part of the length portion with unused filter material sufficient only to effect an increase in the flow rate of the fluid by a certain amount above the undesirably low rate. In this method of operation, the signaling means, switching device, or temperature sensors operate continuously so as to cease operation of the advancement means when the fluid flow rate has been increased as desired. For this purpose, the advancement means may comprise an electric motor which forwards the filter material at a slow rate. This slow rate should be consistent with the control means being able to cease operation of the advancement means when the flow rate has increased to the desired level.

The invention also includes a method for the control of the flow rate of a filtered temperature control fluid through equipment comprising: passing the fluid through a length portion of a length of filter material at the upstream end of a fluid flow passage of the equipment and then along the passage; and, upon attaining an undesirably low rate of fluid through the length portion as the length portion becomes clogged, causing the length of filter material to advance longitudinally to move at lease some of the length portion from the upstream end of the flow passage and move unused filter material across the upstream end of the flow passage thereby to increase fluid flow through the filter material above the undesirably low rate.

The invention further includes a filter arrangement comprising a length of filter material for location with a length portion of the filter material disposed in the flow path of a flowing fluid to be filtered, filter advancement means, and control means actuable upon reaching an undesirably low rate of fluid flow through the length portion, to operate the advancement means so as to advance the length of filter material longitudinally and move at least some of the length portion out of the flow path and move unused filter material into the flow path thereby to increase fluid flow through the filter material above the undesirably low rate.

DESCRIPTION OF THE DRAWINGS

Embodiments of the invention will now be described, by way of example, with reference to the accompanying drawings, in which:

FIG. 1 is an isometric view of electronic equipment according to a first embodiment for use in the telecommunications industry;

FIG. 2 is a cross-sectional view through the equipment of FIG. 1 take along line II—II in FIG. 1;

FIG. 4 is a flow chart showing operational control of a filter in the equipment of the first embodiment;

FIG. 5 is a vertical cross-sectional view through part of electronic equipment forming a modification of the first embodiment and to a larger scale than FIG. 1;

FIG. 6 is a view similar to FIG. 5 of an electronic equipment according to a second embodiment;

FIG. 8 is a view similar to FIG. 6 showing tarts of the second embodiment in different positions;

DESCRPTION OF PSEFERRED EMBODIMENTS

Figure 3:
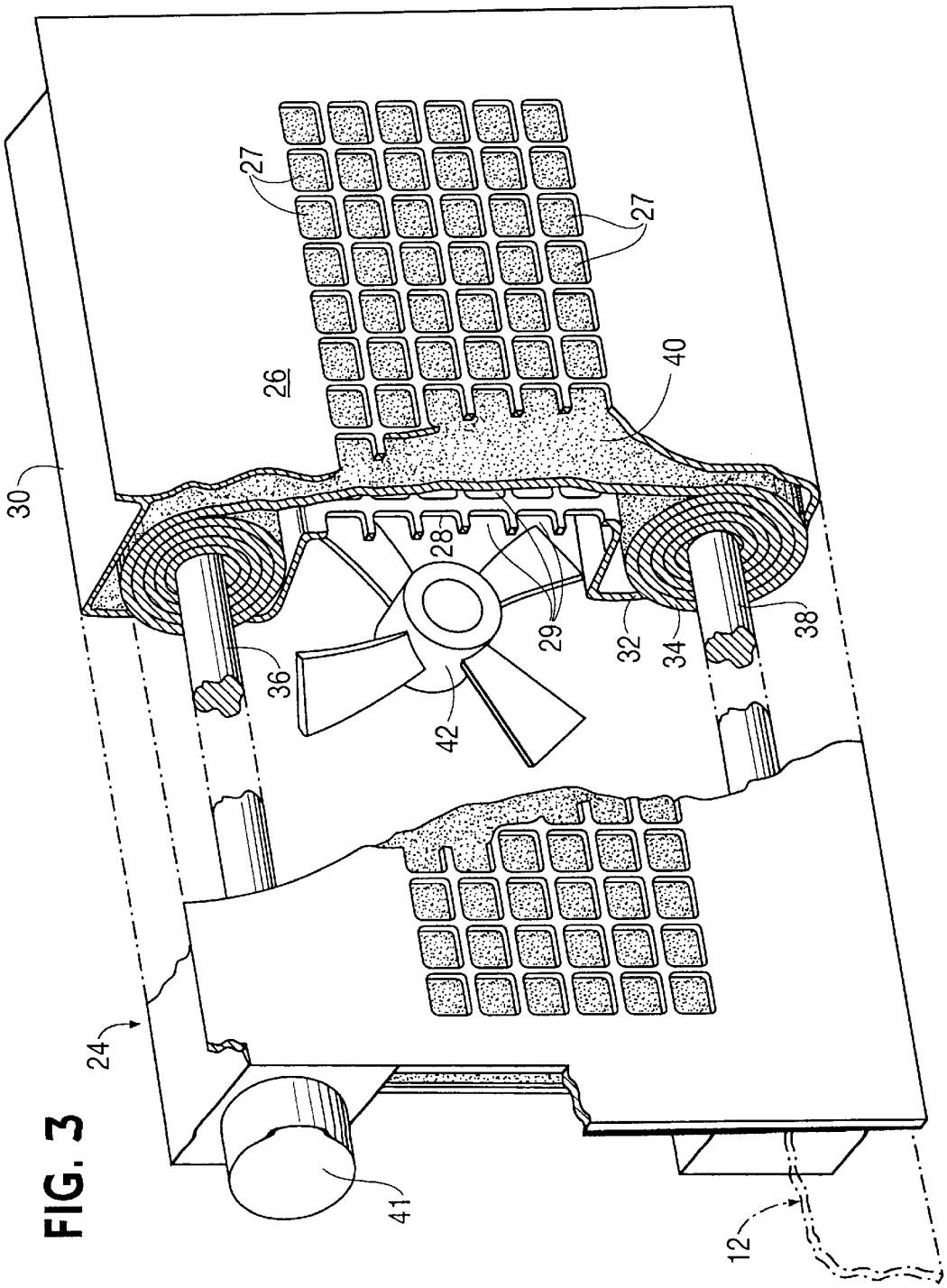
FIG. 3 is an isometric view of part of the equipment of the first embodiment and to a much larger scale

In a first embodiment of the invention as shown in FIG. 1, electronic equipment 10 for use in the telecommunications industry comprises a housing 12 having planar upper and lower walls 14 and 16 (see FIG. 2) and side walls 18. In conventional manner the equipment 10 carries within the housing electronic circuitry units such as printed circuit hoards 20 which are disposed vertically and lie in side-by-side relationship. The spacing between the boards an other items of electronic equipment such as item 22 shown in FIG. 2, creates fluid flow passage of a cooling fluid, i.e. ambient air, for maintaining the various parts of the circuitry comfortably at operational temperatures.

At an upstream end of the fluid flow passages is disposed a filter arrangement 24 to be described in detail below and at their downstream ends, the flow passages terminate in an apertured end wall 25 of the housing for expelling air which transfers heat from the equipment to the surrounding atmosphere.

The filter arrangement 24, and as shown in greater detail in FIG. 3, comprises an apertured outer wall 26 which is spaced from an apertured inner wall 28, with the apertures in the two walls being substantially square as shown and in alignment from wall to wall. The wall 26 forms another end wall for the housing 12. The two walls 26 and 28 are connected at top and bottom by horizontally extending elongate housings 30 and 32 of rectangular cross-section. The housings 30 and 32 extend inwardly into the housing 12 from the wall 26. The filter arrangement is hinged along its bottom edge to the lower wall 16 to enable it to be lowered into the horizontal chaindot position of FIG. 1 for access purposes.

A length of flexible filter material is carried by the structure of the walls 26, 28 and housings 30 and 32. The length of filter material 34 is of a vertical length which far exceeds the distance between the housings 30 and 32 with an upper end region of the filter material passing around a roller device comprising a single roller or spool 36 within the housing 30 and the lower end region extending around another roller device comprising a single roller or spool 38 within the housing 32. The two spools 36 and 38 provide an advancement means for vertical movement of the filter material from the spool 38 to the spool 36. Between the two end regions, the filter material comprises a length portion 40 which extends vertically between the spaced apart walls 26 and 28. In this embodiment the spools 36 and 38 are horizontal and are vertically disposed one above the other for vertical movement of the filter material. Alternatively, not shown, the spools could be horizontally spaced apart and extend vertically for horizontal movement of the filter material. The advancement means also includes a means for driving the roller devices to advance the length of filter material vertically upwards. This driving means comprises a stepper motor 41 carried by an end of the housing 30 for driving the spool 36 for equal angular distances for each operation of the motor. Thus, the spool 36 becomes a take-up spool for used filter material. Alternatively, not shown, a stepper motor could be connected to the lower spool 38 which then becomes the take-up spool for downward movement of the filter material from the spool 36.

The equipment further includes a means for causing fluid flow through the length portion 40 of the filter, i.e. by passage of air through the apertures 27 and 29 in the walls 26 and 28. The means for causing fluid flow comprises a fan means comprising at least one fan 42 which is carried by the housing 12 so as to occupy the vertical space between the two housings 30 and 32 to render the construction compact. Although not shown, in a structure such as in this embodiment, in which the plates 26 and 28 are elongate horizontally, two or more fans may be included and these are spaced apart horizontally.

The equipment also includes a control means for advancing the length of filter material from spool 38 to 36, the filter material upon spool 38 comprising an unused portion of filter material whereas the filter material taken up onto the spool 36 being used filter material. The control means is part of electronic circuitry and, as shown by FIG. 4, comprises a control unit 44 which includes a Darlington array UL2033. The unit 44 receives signals during operation of the equipment, these signals being electrical signals generated by signaling means, i.e. a tachometer 46 of the control unit and forming part of the or each fan 42. Thus, the signaling means is operated by rotation of the fan and as the tachometer operates in conjunction with fan rotation, then an electrical value of the signals will change as the rotational speed of the fan changes. The signal received from the tachometer when the fan 42 is operating at its normal rotational speed does not cause any output to be sent from the control unit 44 to rotate the spool 36. However, as the signals change in value, as will be discussed, this will then cause the control unit 44 to energize the stepper motor 41 to drive it and the spool 36 for its specific angular displacement as will be discussed.

The spool 36 is also provided with a detector 48 (see FIG. 4) which sends a signal along line 50 to the control unit when the spool 36 has rotated sufficiently to accommodate most of the length of filter material as used material upon that spool. Hence, this indicates that the spool 38 holds very little unused filter material. Upon receiving this signal from the detector 48, the control unit 44 sends a signal along line 52 to a central office to indicate to maintenance personnel that the length of filter material requires replacing.

In operation of the equipment of the first embodiment and with a substantially unused length of filter material 34 provided in the filter arrangement, a rather short length of filter material extends around the spool 36. To hold the temperatures at various parts of the equipment within operational electronic equipment, within operational temperature ranges for the circuitry and for the electronic equipment, the fan means operates automatically to draw ambient cooling air through the apertured walls 26 and 28 and thus through the length portion 40 of the filter between the walls. Warmed air then exits through the end wail 26 of the equipment with the flow of air through the equipment being indicated by the arrows in FIG. 2.

The length portion of the filter material when operating effectively filters out dust and other substances in the ambient air and which could cause damage to the circuitry or electronic components. As filtering proceeds, the filter gradually becomes clogged thereby effectively reducing the flow rate of the cooling air through the equipment. This flow rate reduction is progressive and causes a progressive increase in temperature ranges within the equipment itself which could lead to eventual breakdown if permitted to progress too far. In order to prevent this from happening, it is necessary to move the length portion 40 of the filter material onto the roll 36 and replace it with unused filter material from the spool 38, this unused filter material providing a succeeding and unused length portion 40 of filter material between the walls 26 and 28.

In order to control and initiate the movement of the filter material in the above fashion, the equipment is designed such that the signals sent from the tachometer 46 along line 54 change in electrical value and have a specific value corresponding to an undesirably low rate of fluid flow through the used length portion 40. This undesirably low rate of fluid flow is determined to occur at temperatures within the equipment which are below those which could cause damage or breakdown to the equipment. The fan means is placed sufficiently closely downstream from the length portion 40 of filter material that a noticeable drag effect commences and increases upon the rotational speed of the fan means as the length portion gradually becomes clogged. This is because of an increasing vacuum effect that the fan produces between itself and the length portion 40 of the filter material as this becomes progressively clogged. The value of the signals thus changes as the fan rotational speed decreases. Upon receiving the specific value of signals (as discussed above), the control unit 44 causes energization of the stepper motor 41 along line 53. The stepper motor 41 then rotates a sufficient angular distance to take up the whole of the used length portion from the spool 33. The flow rate will then increase to desirable operating rates and away from the undesirably low rate.

It follows, therefore, that a clogged filter, i.e., a length portion 40, is automatically changed while maintaining continued operation of the equipment and without maintenance or supervision from maintenance personnel. Hence, if the equipment is to be used in the outside environment and clogged of the filter occurs relatively quickly, then there is no possibility or breakdown or damage to the equipment while awaiting filter change by a maintenance person. The embodiment, as with other embodiments to be described, is also of use for equipment to be used indoors as the supervision and maintenance required is also minimized without the possibility of overheating causing damage or breakdown.

When the length of filter material has advanced sufficiently far as to be mostly used, the detector 48 sends a message to the electronic control, as discussed above, whereby an alarm signal is sent along line 52 to the central office to enable maintenance personnel to replace the substantially used length of filter material.

In other embodiments arid modifications to the embodiments now to be discussed, similar features bear the same reference numerals.

In a first modification of the first embodiment, and which is visually as shown by FIGS. 1 to 4, the stepper motor 41 is now an electrical motor 41 which may be de-energized as required after any of an infinite number of angular movements of rotation. In this modification, the tachometer 48 continues to send electrical signals to the control unit as the electrical motor 41 rotates so as to wind up used filter material onto the spool 36. The motor rotates slowly. As the length of material is advanced, unused filter material moves increasingly upward behind the wall 26. This progressively increases fan rotational speed and its corresponding increase in fluid flow rate. When the value of electrical signals departs from the specific value and which indicates an acceptable fluid flow rate, the motor is de-energized. Hence, the whole of a used length portion 40 need not necessarily be replaced by unused material.

The roller devices as used in the first and later embodiments do not necessarily employ only a single take-up roll. For instance, as shown in a second modification of the first embodiment in FIG. 5, where space is available in a specific electronic equipment 56 the spools 36 and 38 are replaced with two upper take-up rolls 57 and the lower spool 38 is replaced with two give-up Spools 58. This enables a length of filter material 34 of greater length to be used than is possible in the first embodiment. The filter material extends partly around each of the spools 57 and from one spool to the other as shown in FIG. 5 so that the storage for take-up filter material is increased. Similarly, the give-up spools 58 accommodate more unused filter material.

Figure 7:
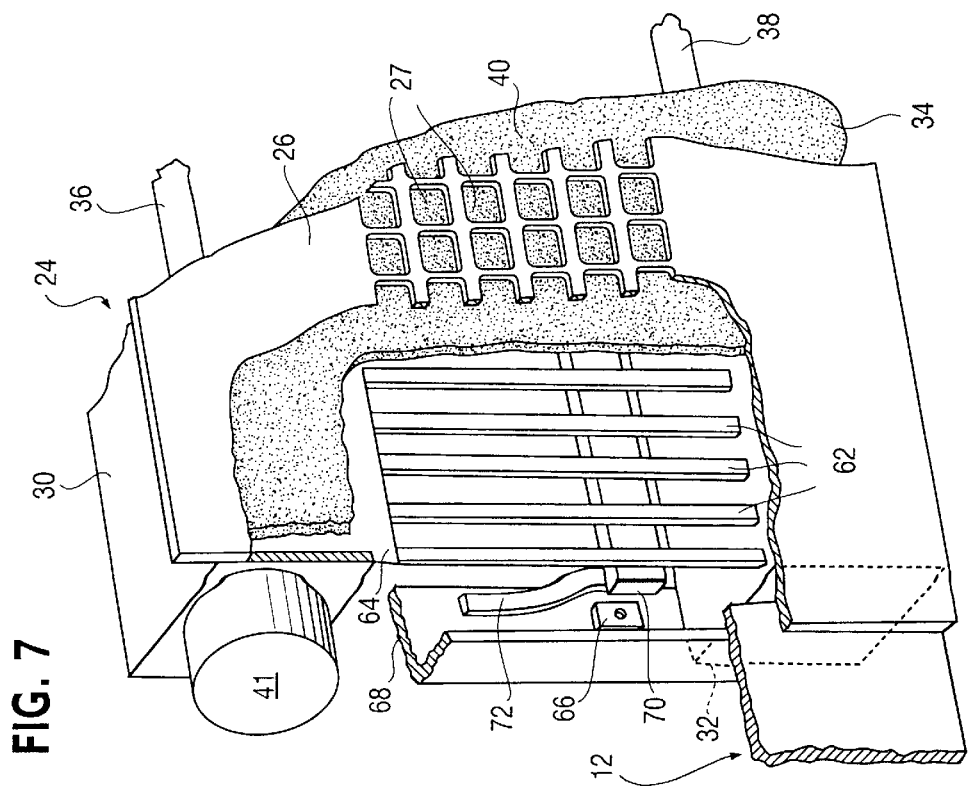
FIG. 7 is an isometric view of part of the equipment of the second embodiment and taken in the same direction as FIG. 1.

Electronic equipment according to a second embodiment is shown in FIGS. 6, 7 and 8. This embodiment is similar to the first embodiment except that the control means does not include an electrical signaling means operated by fan rotation. The equipment of the second embodiment relies upon the length portion 40 of the filter material 34 flexing to an increased degree, as it becomes clogged, for operation of the control means. For this purpose, the apertured inner wall 28 of the equipment of the first embodiment is replaced in the second embodiment by a plurality or vertically extending arid parallel resilient wires or leaf springs 62. These hang downwardly from attachments at their upper ends to a skirt 64 of the housing 30. The springs 62 terminate spaced slightly above the lower housing 32. The length portion 40 of filter material is held between the wall 26 and the springs 62 which provide a resilient flexible support means to the downstream side of the length portion 40.

The control means for operating the stepper motor 41 includes, in this embodiment, two electrical pressure switches 66 (one being shown) disposed one at each side of the opening in. the housing 12 for reception of the housing 24. Each pressure switch 66 is attached to an inside flange 68 of the housing 12 so as to face, for operation, towards the length portion 40 of the filter material. Directly behind the springs 62 is disposed a rigid horizontal bar 70 which is urged towards the spring 62 by two leaf springs 72 which engage the two ends of the bar 70 and are mounted upon the flange 68 as shown in FIG. 7.

During operation of the equipment according to the second embodiment, the unused length portion 40 of the filter material is initially disposed substantially vertically as shown in FIG. 6. At this time, the springs 62 also extend vertically and the bar 70 is held spaced away from the pressure switches 66 by the leaf springs 72. However, as the length portion 40 progressively becomes clogged with filtered materials, the air pressure upon the filter, combined with the reduction in pressure on the downstream side of the length portion 40, created by operation of the fan means, causes a progressive flexing of the length portion 40 in the direction of fluid flow. This flexing of the filter material causes the resilient springs 62 to flex rearwardly thereby urging the bar 70 in a rearward direction. Upon the filter material flexing to a degree which corresponds to the fluid flow through the length portion 40 reaching an undesirably low rate, the springs 62 move the bar 70 into operational contact with one or both of the pressure switches 66 which then immediately causes the control means to operate the stepper motor 41. These positions of the length portion 40, the springs 62 and the bar 70 in contact with a pressure switch 66 are shown in FIG. 8. The length of filter material is then caused to move upwardly to take up the unused length portion onto the spool 36 and insert a new length portion 40 directly behind the wall 26 in a manner similar to that of described in the first embodiment.

Third and fourth embodiments, now to be described, rely upon operation of the control means by using temperature changes within the equipment as fluid flow decreases due to progressive clogging of a length portion 40 of filter material.

Figure 9:
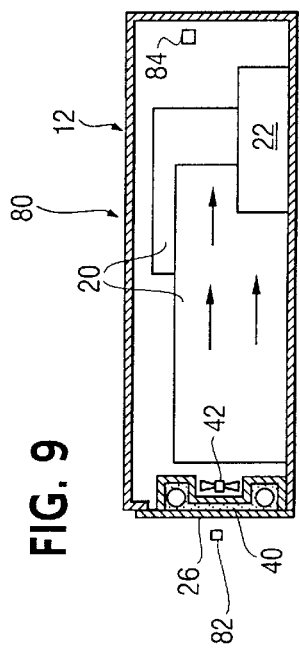
FIG. 9 is a view similar to FIG. 2 of a third embodiment.

For instance, in the third embodiment, as shown by FIG. 9, an electronic equipment 80 is devoid of any device for operating the control means by using fan rotational speed or by using flexing of the filter material. In the third embodiment, the length portion 40 of filter material is contained between walls 26 and 28 as described in the first embodiment.

In the third embodiment the control means comprises a first temperature sensor, i.e. a thermistor 82 carried by the housing 12 immediately upstream of the wall 26 in the direction of fluid flow. Another thermistor 84 is disposed within a downstream region of the fluid flow passages within the equipment.

During operation of the equipment of the third embodiment, and with the length portion 40 of filter material substantially unused, then temperature control within the equipment is satisfactorily held within safe working temperature ranges. The incoming air temperature and the temperature at the downstream regions of the flow passages are continuously monitored by the thermistors 82 and 84. While the operating temperatures within the equipment are to be controlled, it is important to recognize the temperatures at the downstream regions are also governed by temperatures outside the equipment. Thus, variations in incoming air temperature are directly related to outside temperatures as are variations in heat emission by radiation into the outside atmosphere. The thermistor 82 measures the incoming air temperature to accommodate for the outside temperature conditions. The monitored temperatures from the thermistor 82 are compared with those from the thermistor 84. Upon differential temperature conditions being reached as measured by the two thermistors and which correspond to an undesirably low rate of fluid flow being attained, then the control means is operated to cause operation of the stepper motor 41 (not shown in the third embodiment) to move the used length portion 40 of filter material onto the spool 36. Simultaneously with this, an unused length portion 40 drawn from the spool 38 to lie at the upstream end of the fluid path, i.e. directly behind the wall 26. The fluid flow rate will then increase to the degree required for control of the cooling temperatures of the air within the equipment.

Figure 10:
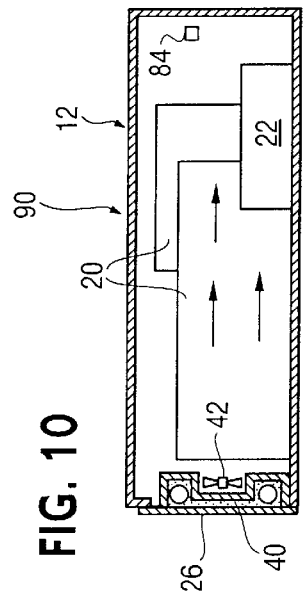
FIG. 10 is a view similar to FIG. 9 of a modification of the third embodiment.

In a fourth embodiment with reference to FIG. 10, electronic equipment 90 is similar to that of the third embodiment except that the thermistor 82 is not included. With this embodiment, the thermistor 84 monitors the air temperature as it is about to exit the equipment and will operate the control means for advancement of the length of filter material when the monitored temperature indicates an undesirably low flow rate of cooling air passing through the equipment. This embodiment is not intended to take into account the ambient air temperature before operation of the control means.

What is claimed is:

1. A method for the control of flow rate of a filtered temperature control fluid through equipment comprising:
   passing the fluid through a length portion of filter material at the upstream end of a fluid flow passage of the equipment and the along the passage; and
   upon attaining an undesirably low rate of fluid flow through the length portion of filter material as determined by one of a drag effect created upon a rotational speed of a fan disposed close to the length portion of filter material, an amount of flex of the length portion of filter material, and a temperature in a downstream region of the fluid flow passage, causing the length of filter material to advance longitudinally to move at least some of the length portion from the upstream end of the fluid flow passage and move unused filter material across the upstream end of the flow passage thereby to increase fluid flow through the filter material above the undesirably low rate.

2. A method according to claim 1 comprising passing the fluid through the length portion of the filter material by use of the fan, which is disposed sufficiently close to the length portion so as to create an increasing drag effect upon the rotational speed of the fan as fluid flow rate through the length portion decreases, providing a signal created by the fan when the fan rotational speed decreases to a value corresponding to the undesirably low rate of fluid flow, and upon creation of the signal, causing the length of filter material to advance longitudinally.

3. A method according to claim 1 comprising causing the length portion of the filter material to flex progressively downstream because of differential pressure conditions as fluid flow rate progressively decreases through the length portion, and upon the length portion flexing to a degree which corresponds to the undesirably low rate of fluid flow, causing the length portion to operate a switching means to cause the length of filter material to advance longitudinally.

4. A method according to claim 1 comprising sensing temperature conditions at a downstream region of the fluid flow passage, and upon an undesirably high temperature being reached in the downstream region which corresponds to the undesirably low rate of fluid flow, causing the length of filter material to advance longitudinally.

5. An apparatus comprising:
   a housing,
   a fluid flow passage for flow of a filtered temperature control fluid through the housing,
   a length of filter material having a length portion extending across an upstream end of the flow passage for filtering undesirable material from the fluid,
   a fan means for causing fluid flow through the length portion and along the flow passage, the fan means having at least one fan disposed downstream in the flow passage from the length portion of the filter material,
   filter advancement means, and
   control means, actuable upon reaching an undesirably low rate of fluid flow through the length portion as determined by a drag effect created upon a rotational speed of the fan, to operate the advancement means so as to advance the length of filter material for a distance longitudinally to move at least some of the length portion from the upstream end of the flow passage and move unused filter material across the upstream end of the flow passage thereby to increase fluid flow through the filter material above the undesirably low rate.

6. An apparatus according to claim 5 wherein the filter material is flexible and the advancement means comprises a roller device for take-up of used filter material and means for driving the roller device to advance the length of filter material.

7. An apparatus according to claim 6 wherein the roller device comprises a single take-up roll.

8. An apparatus according to claim 6 wherein the roller device comprises two parallel and spaced rolls and the used filter material extends partly around the two rolls and from one roll to the other.

9. An apparatus according to claim 6 wherein the means for driving the roller device comprises a stepper motor which has a driving shaft rotatable for equal angular distance for each operation of the motor.

10. An apparatus according to claim 6 wherein the means for driving the roller device comprises and electric motor which is operable to replace the whole of the used length portion with unused filter material.

11. An apparatus according to claim 6 wherein the means for driving the roller device comprises an electric motor, operation of which is controlled by the control means for the advancement means to cease advancing the filter materiel upon the flow rate of the fluid increasing by a certain amount above the undesirably low flow rate.

12. An apparatus according to claim 5 wherein the filter material is flexible and the advancement means comprises a roller device for take-up of used filter material, means for driving the roller device to advance the length of filter material, and a further roller device for storing and releasing the unused filter material.

13. An apparatus according to claim 1 wherein the control means also includes electrical signalling means operated by rotation of the fan, the fan disposed sufficiently close to the length portion of the filter material so that an increased drag effect is created upon the rotational speed of the fan as the fluid flow rate through the length portion decreases thereby varying an electrical value of the signal, the control means being actuated upon the signal reaching a value corresponding to the undesirably low rate of fluid flow so as to operate the advancement means to advance the length of filter material.

14. A filter arrangement comprising:

a length of filter material, a length portion of the filter material disposed in the flow path of a flowable fluid to be filtered, filter advancement means, and control means, actuable upon reaching an undesirably low rate of fluid flow through the length portion as determined by an amount of flex of the length portion of filter material, to operate the advancement means so as to advance the length of filter material longitudinally to move at least some of the length portion out of the flow path and move unused filter material into the flow path thereby to increase fluid flow through the filter material above the undesirably low rate.

15. An apparatus comprising:

a housing, a fluid flow passage for flow of a filtered temperature control fluid through the housing, a length of filter material having a length portion extending across an upstream end of the flow passage for filtering undesirable material from the fluid, means for causing fluid flow through the length portion and along the flow passage, filter advancement means, and control means, actuable upon reaching an undesirably low rate of fluid flow through the length portion as determined by an amount of flex of the length portion of filter material, to operate the advancement means so as to advance the length of filter material for a distance longitudinally to move at least some of the length portion from the upstream end of the flow passage and move unused filter material across the upstream end of the flow passage thereby to increase fluid flow through the filter material above the undesirably low rate.

16. An apparatus comprising:

a housing, a fluid flow passage for flow of a filtered temperature control fluid through the housing, a length of filter material having a length portion extending across an upstream end of the flow passage for filtering undesirable material from the fluid, means for causing fluid flow through the length portion and along the flow passage, filter advancement means, and control means, actuable upon reaching an undesirably low rate of fluid flow through the length portion as determined by a temperature in a downstream region of the fluid flow passage, to operate the advancement means so as to advance the length of filter material for a distance longitudinally to move at least some of the length portion from the upstream end of the flow passage and move unused filter material across the upstream end of the flow passage thereby to increase fluid flow through the filter material above the undesirably low rate.

17. An apparatus according to claim 15 wherein the length portion of the filter material is caused to flex downstream because of differential pressure conditions as the fluid flow rate drops, and the control means comprises a switching device which is operated when the length portion of filter material flexes to a degree which corresponds to reaching the undesirably low rate of fluid flow, operation of the switching device causing operation of the advancement means to advance the length of filter material.

18. An apparatus according to claim 17 wherein the switching device comprises an electrical pressure switch, and resilient flexible support means is disposed immediately downstream of the length portion of the filter material to support the downstream side of the length portion, the flexible support means being caused to flex resiliently downstream by pressure applied to it as the length portion flexes, and as the length portion flexes to a degree which corresponds to reaching the undesirably low fluid flow rate, the flexible support means effects operation of the pressure switch.

19. An apparatus according to claim 16 wherein the control means comprises a temperature sensor located at a downstream region of the fluid flow passage, the temperature sensor causing operation of the control means, and upon an undesirably high temperature being reached which corresponds to the undesirably low fluid flow rate, the temperature sensor causes actuation of the control means to operate the advancement means to advance the length of filter material.

20. An apparatus according to claim 16 wherein the control means comprises one temperature sensor located at a downstream region of the fluid flow passage, and another temperature sensor disposed upstream of the length portion of filter material, and upon differential temperature conditions being reached, as sensed by the sensors, and corresponding to the undesirably low fluid flow, the control means is caused to be actuated to operate the advancement means to advance the length of filter material.

* * * * *